United States Patent
Yim et al.

(10) Patent No.: US 10,727,368 B2
(45) Date of Patent: Jul. 28, 2020

(54) OPTOELECTRONIC DEVICE MODULE HAVING A SILICON INTERPOSER

(71) Applicant: Intel Corporation, Santa Clara, CA (US)

(72) Inventors: Myung Jin Yim, San Jose, CA (US); Seungjae Lee, Seoul (KR); Sandeep Razdan, Burlingame, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/074,758

(22) PCT Filed: Apr. 1, 2016

(86) PCT No.: PCT/US2016/025746
§ 371 (c)(1),
(2) Date: Aug. 1, 2018

(87) PCT Pub. No.: WO2017/171878
PCT Pub. Date: Oct. 5, 2017

(65) Prior Publication Data
US 2019/0006549 A1  Jan. 3, 2019

(51) Int. Cl.
*H01L 27/15* (2006.01)
*H01L 31/12* (2006.01)
(Continued)

(52) U.S. Cl.
CPC ............ *H01L 31/12* (2013.01); *H01L 23/367* (2013.01); *H01L 23/48* (2013.01);
(Continued)

(58) Field of Classification Search
CPC . H01L 2224/16145; H01L 2224/16235; H01L 2224/32145; H01L 31/12; H01L 31/125; H01L 23/367
See application file for complete search history.

(56) References Cited

U.S. PATENT DOCUMENTS

2013/0279844 A1 10/2013 Na et al.
2014/0029639 A1* 1/2014 Zarbock ............... H01L 25/167
372/50.1

(Continued)

FOREIGN PATENT DOCUMENTS

WO  WO-2013100995  7/2013
WO  WO-2013115780  8/2013

OTHER PUBLICATIONS

International Search Report and Written Opinion for International Patent Application No. PCT/US2016/025746 dated Dec. 8, 2016, 13 pgs.

(Continued)

*Primary Examiner* — Samuel A Gebremariam
(74) *Attorney, Agent, or Firm* — Schwabe, Williamson & Wyatt, P.C.

(57) ABSTRACT

Optoelectronic device modules having a silicon photonics transmitter die connected to a silicon interposer are described. In an example, the optoelectronic device module includes a silicon photonics transmitter die connected to a silicon interposer, and the silicon interposer is disposed between the silicon photonics transmitter die and a substrate. The silicon interposer provides an electrical interconnect between the silicon photonics transmitter die and the substrate, and reduces a likelihood that a hybrid silicon laser on the silicon photonics transmitter die will be damaged during module operation.

16 Claims, 14 Drawing Sheets

(51) Int. Cl.
    H01L 23/00      (2006.01)
    H01L 25/065     (2006.01)
    H01L 23/48      (2006.01)
    H01L 23/367     (2006.01)
    H01L 23/498     (2006.01)
    H01L 25/16      (2006.01)
    H01L 33/58      (2010.01)
    H01L 33/62      (2010.01)
(52) U.S. Cl.
    CPC ........ *H01L 23/49827* (2013.01); *H01L 24/00* (2013.01); *H01L 25/0657* (2013.01); *H01L 25/167* (2013.01); *H01L 33/58* (2013.01); *H01L 33/62* (2013.01); *H01L 2224/0401* (2013.01); *H01L 2224/1403* (2013.01); *H01L 2224/14051* (2013.01); *H01L 2224/16145* (2013.01); *H01L 2224/16227* (2013.01); *H01L 2224/16235* (2013.01); *H01L 2224/171* (2013.01); *H01L 2224/32145* (2013.01); *H01L 2224/32225* (2013.01); *H01L 2224/73204* (2013.01); *H01L 2224/73253* (2013.01); *H01L 2224/81203* (2013.01); *H01L 2224/81815* (2013.01); *H01L 2224/92225* (2013.01); *H01L 2225/06513* (2013.01); *H01L 2225/06517* (2013.01); *H01L 2225/06534* (2013.01); *H01L 2924/1433* (2013.01); *H01L 2924/1434* (2013.01); *H01L 2924/15311* (2013.01); *H01L 2933/0033* (2013.01); *H01L 2933/0066* (2013.01)

(56) References Cited

U.S. PATENT DOCUMENTS

| 2014/0042463 | A1 | 2/2014 | Uemura et al. | |
| 2014/0092576 | A1* | 4/2014 | Lucero | H01L 25/167 361/783 |
| 2014/0321804 | A1* | 10/2014 | Thacker | G02B 6/4274 385/14 |

OTHER PUBLICATIONS

International Preliminary Report on Patentability for International Patent Application No. PCT/US2016/025746 dated Oct. 11, 2018, 10 pages.

Search Report for European Patent Application No. 16897416.0 dated Nov. 21, 2019, 10 pages.

* cited by examiner

A - A

B - B

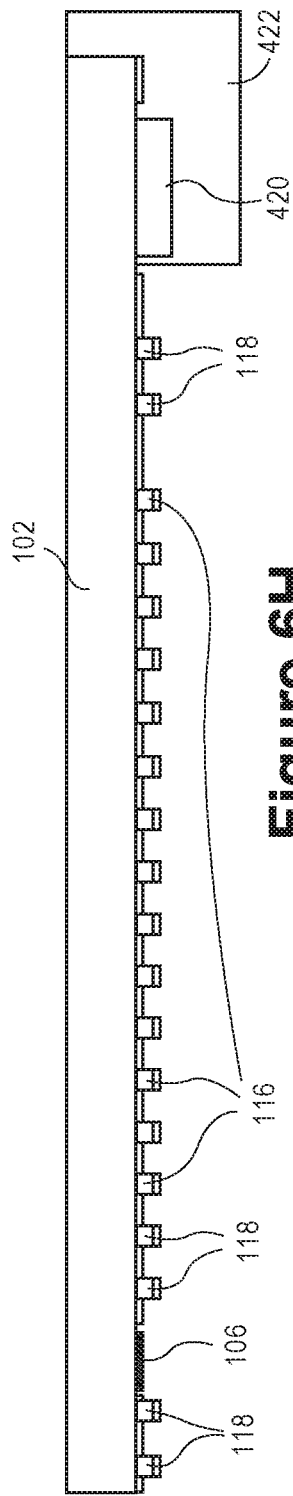
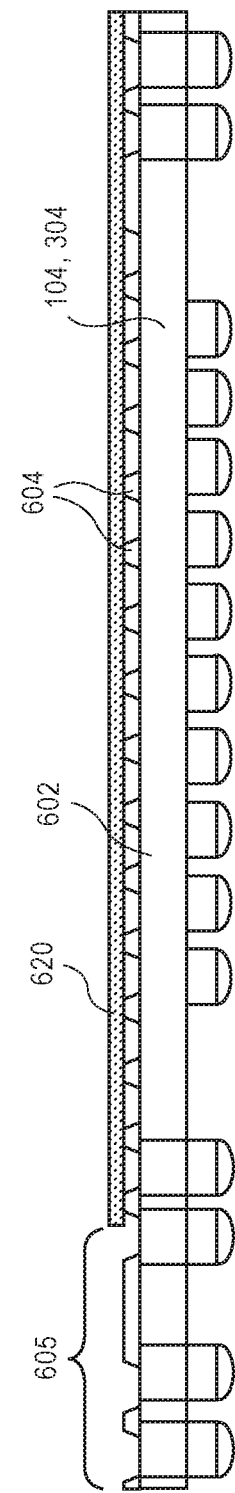
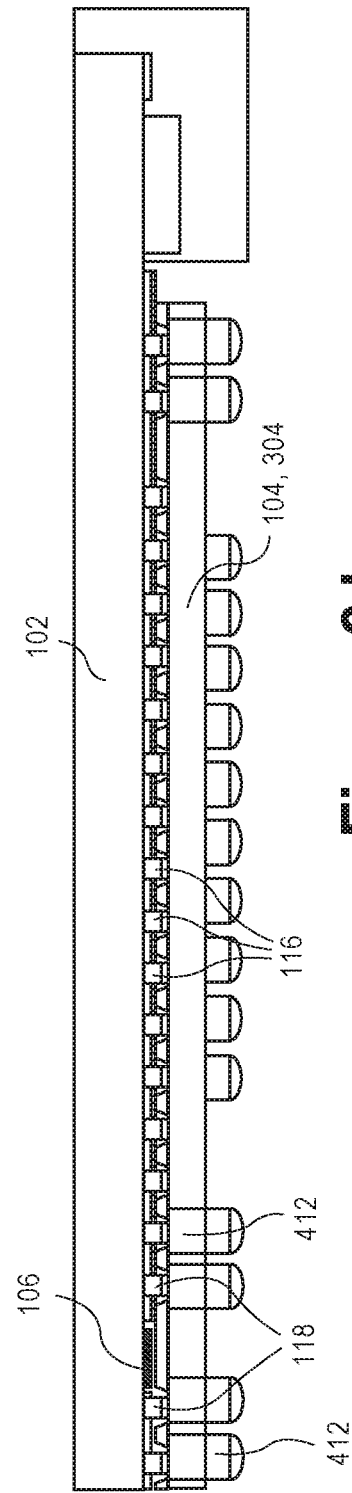

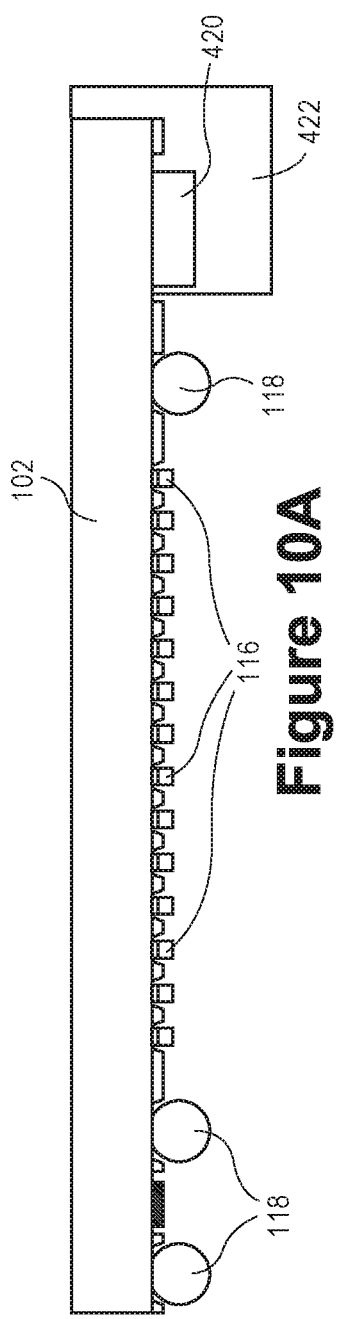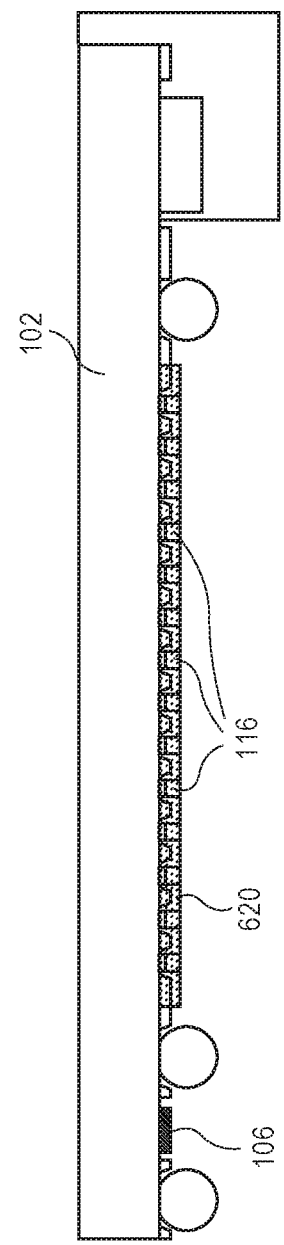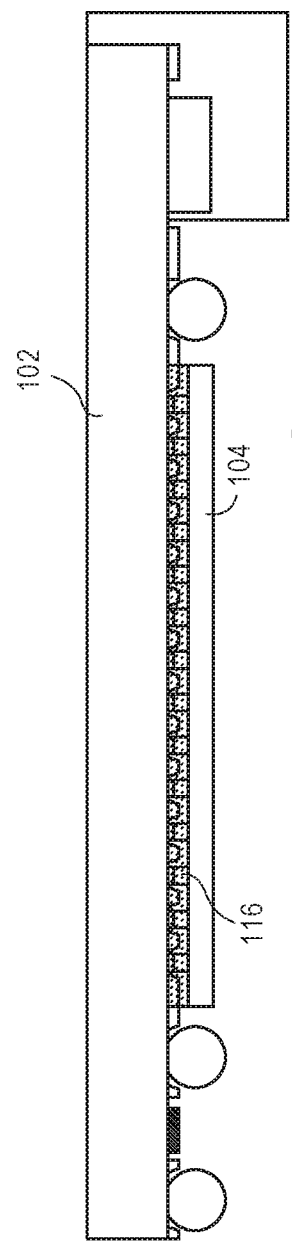

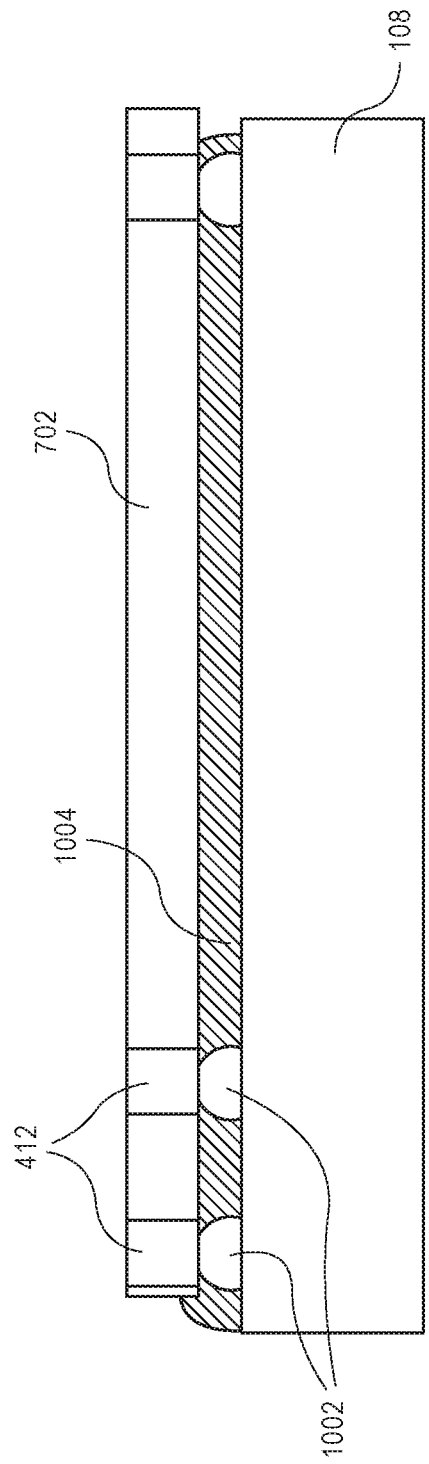
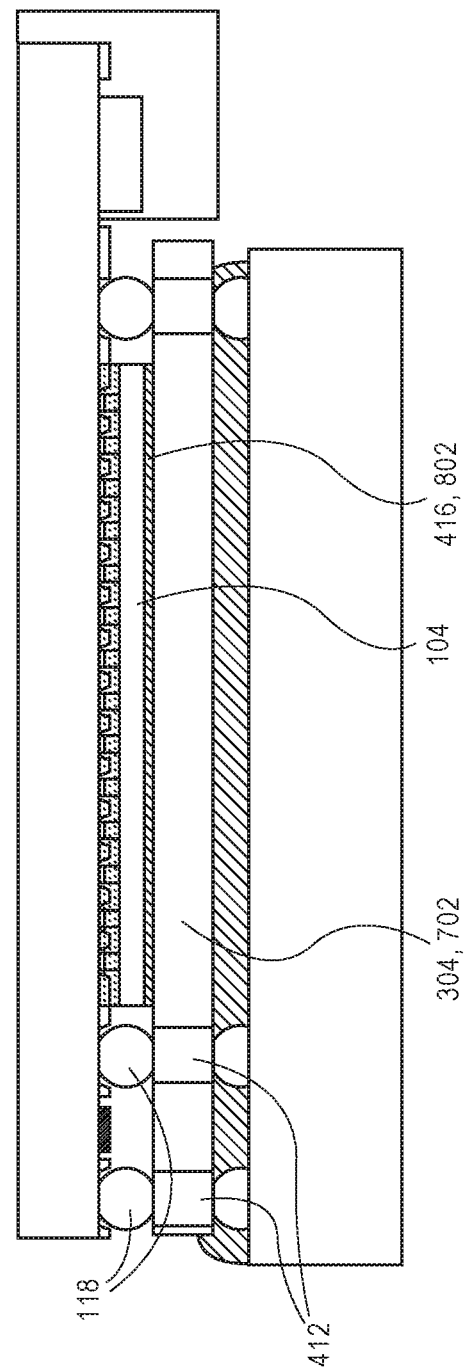

OPTOELECTRONIC DEVICE MODULE HAVING A SILICON INTERPOSER

CROSS-REFERENCE TO RELATED APPLICATION

This patent application is a U.S. National Phase Application under 35 U.S.C. § 371 of International Application No. PCT/US2016/025746, filed Apr. 1, 2016, entitled "OPTOELECTRONIC DEVICE MODULE HAVING A SILICON INTERPOSER," which designates the United States of America, the entire disclosure of which is hereby incorporated by reference in its entirety and for all purposes.

TECHNICAL FIELD

Embodiments are in the field of silicon photonics and, in particular, optoelectronic device modules having a silicon photonics transmitter die.

BACKGROUND

Modern data centers require high-bandwidth, low-power optical interconnects between servers and chips to handle the increasing functional demands of Big data and connectivity. To service this need, a highly-integrated optical module having a hybrid laser array integrated on a silicon platform may be used. The highly-integrated optical module is an application of "silicon photonics," and can allow for an optolectronic device module to be developed having a bandwidth exceeding 100 Gbps. The optoelectronic device module may thus be used for high performance computing, e.g., as an on-board optical pluggable module for a Big data center.

BRIEF DESCRIPTION OF THE DRAWINGS

FIGS. 6A-6L illustrate operations of a method of fabricating an optoelectronic device module having a silicon interposer, in accordance with an embodiment.

FIGS. 10A-10E illustrate operations of a method of fabricating an optoelectronic device module having a silicon interposer, in accordance with an embodiment.

DESCRIPTION OF EMBODIMENTS

Optoelectronic device modules having a silicon photonics transmitter die connected to a silicon interposer are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Figure 1:
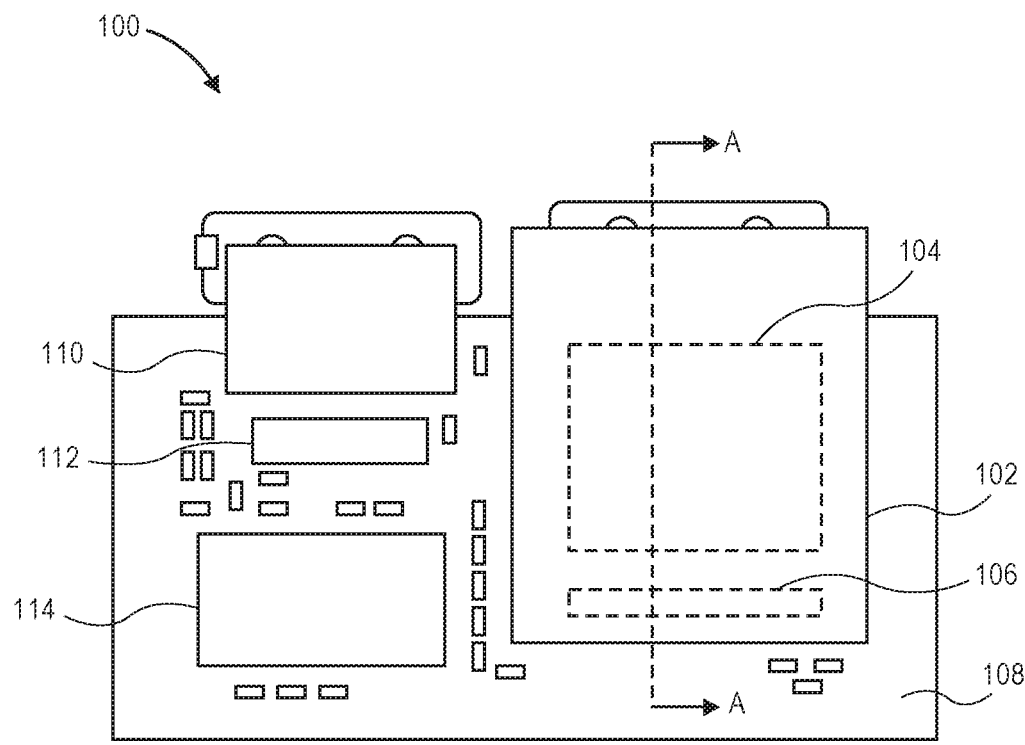
FIG. 1 illustrates a top-down view of an optoelectronic device module.

Referring to FIG. 1, a top-down view of an optoelectronic device module is shown. An optoelectronic device module 100 having bandwidths over 100 Gbps, e.g., 400 Gbps, may include a silicon photonics transmitter (STX) die 102 attached to a transmitter driver die (TX IC 104). A hybrid silicon laser 106 may be integrated in STX die 102 and laterally offset from TX IC 104, as represented by hidden lines. Thus, STX die 102 may be mounted on a substrate 108 using a flip-chip attachment such that TX IC 104 and hybrid silicon laser 106 are disposed between a top surface of STX die 102 and a top surface of substrate 108.

Optoelectronic device module 100 may include several photonics subassemblies. For example, in addition to the photonics transmitter subassembly having STX die 102 and TX IC 104, a die layout of optoelectronic device module 100 may include a photonics receiver subassembly having a silicon photonics receiver (SRX) die 110 and a receiver driver die 112 mounted on substrate 108. The die layout may include other dies mounted on substrate 108, e.g., a power management IC (PMIC 114).

Figure 2:
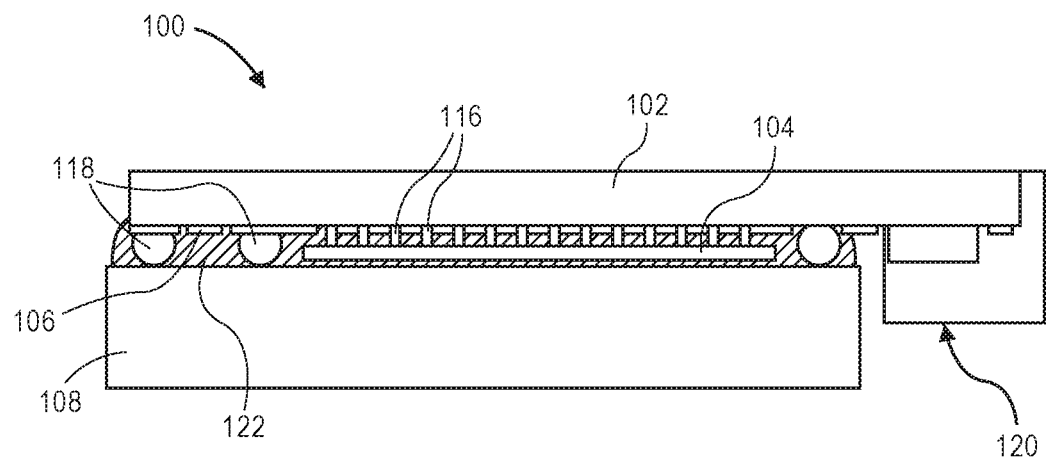
FIG. 2 illustrates a sectional view, taken about line A-A of FIG. 1, of an optoelectronic device module.

Referring to FIG. 2, a sectional view, taken about line A-A of FIG. 1, of an optoelectronic device module is shown. Photonics subassemblies of optoelectronic device module 100 may incorporate a flip-chip structure. For example, STX die 102 may be interconnected with TX IC 104 through several chip-on-chip (CoC) interconnects 116, e.g., copper pillars. Furthermore, STX die 102 may be interconnected with substrate 108 through several chip-on-substrate (CoS) interconnects 108, e.g., solder bumps. Accordingly, a stack-up structure of optoelectronic device module 100 may include TX IC 104 and hybrid silicon laser 106 disposed between STX die 102 and substrate 108.

Photonics subassemblies of optoelectronic device module 100 may incorporate an optical die overhang structure. For example, STX die 102 and/or SRX die 110 may include an optical coupling structure 120 to direct light from hybrid silicon laser 106 to a photodetector 302 (not shown) as described below. Thus, the overhang structure may optically couple STX die 102 to SRX die 110.

Components of optoelectronic device module 100 may be encapsulated by a nonconductive encapsulation 122, e.g., a nonconductive film (NCF) or a polyimide passivation layer (PI), to stabilize or protect the components. For example, nonconductive encapsulation 122 may include one or more of a nonconductive film, a capillary underfill material, or another nonconductive material surrounding the CoC interconnects 116 or CoS interconnects 118 to stabilize attachments between the module dies and substrate 108.

Current architectures for optoelectronic device modules 100 may include nonconductive encapsulation 122 covering hybrid silicon laser 106. That is, as shown in FIG. 2, an underfill material protecting CoS interconnects 118 may fill a space between hybrid silicon laser 106 and substrate 108. Thus, the underfill material may compromise a stability of hybrid silicon laser 106. More particularly, a coefficient of thermal expansion (CTE) of STX die 102 may differ from a CTE of substrate 108, and temperature changes during operation of optoelectronic device module 100 may therefore cause nonconductive encapsulation under hybrid silicon laser 106 to bend or swell and press against hybrid silicon laser 106. Accordingly, a long-term reliability of optoelectronic device module 100 may be compromised by the presence of nonconductive encapsulation 122 in the space below hybrid silicon laser 106.

The long-term reliability of optoelectronic device module 100 may be increased by an architecture that maintains the electrical, thermal, and optical paths between the components of the photonics subassemblies, while reducing the likelihood of damage to the hybrid silicon laser 106 caused by thermo-mechanical stress induced by CTE mismatch during module operation. In an aspect, an optoelectronic device module 100 includes STX die 102 electrically connected to substrate 108 through a silicon interposer disposed between hybrid silicon laser 106 and substrate 108. More particularly, STX die 102 may include CoS interconnects 118 attached to through silicon vias (TSVs) in the silicon interposer to electrically connect STX die 102 to substrate 108 through the TSVs. This architecture, as described more fully below, may provide protection of hybrid silicon laser 106 and reliable interconnection between the photonics transmitter subassembly components. Furthermore, embodiments of optoelectronic device module 100 may include a thermal bridge between TX IC 104 and the silicon interposer, or between the silicon interposer and substrate 108, to provide a thermal dissipation path to increase reliability of optoelectronic device module 100. Optoelectronic device module 100 having STX die 102 electrically connected to substrate 108 through a silicon interposer may be fabricated using industry-known manufacturing processes carried out according to the sequences of operations described below. Furthermore, the silicon interposer may allow for a reduced form factor, e.g., an x-y footprint or z-height thickness, of optoelectronic device module 100 as compared to existing architectures.

Figure 3:
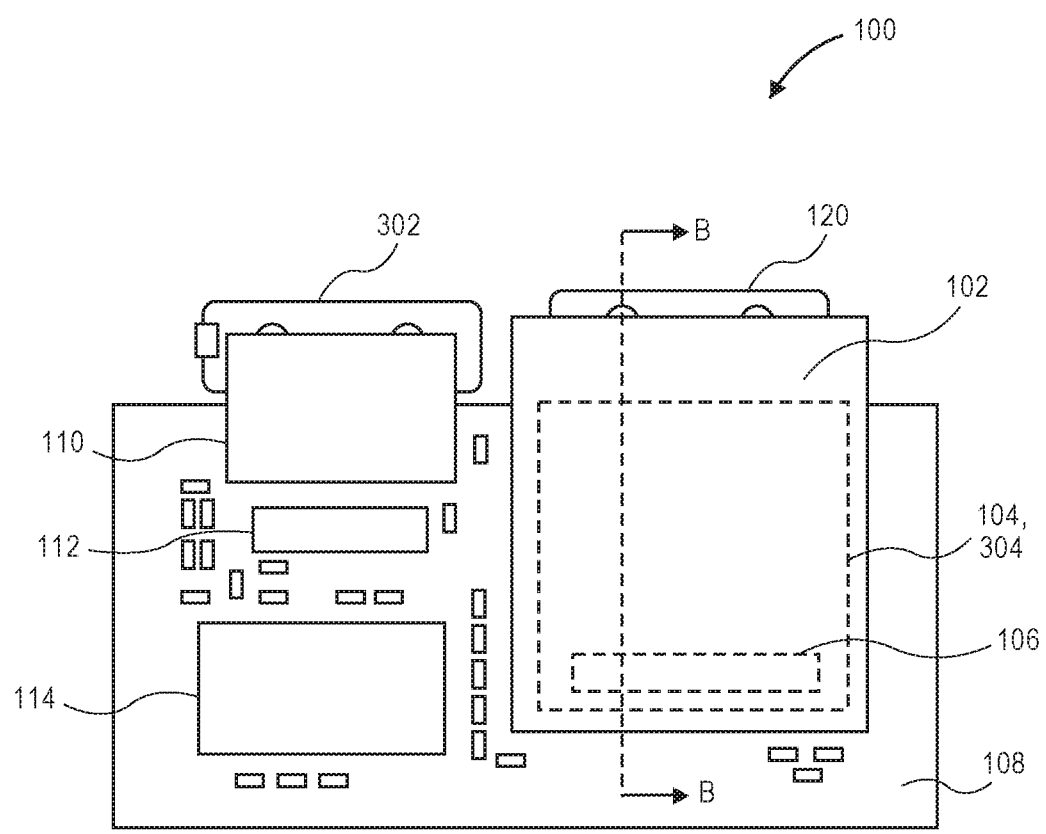
FIG. 3 illustrates a top-down view of an optoelectronic device module having a silicon interposer, in accordance with an embodiment.

Referring to FIG. 3, a top-down view of an optoelectronic device module having a silicon interposer is shown in accordance with an embodiment. Optoelectronic device module 100 may include STX die 102 having a bottom surface facing a top surface of substrate 108. STX die 102 may include hybrid silicon laser 106, represented by hidden lines in FIG. 3, on the bottom surface. That is, hybrid silicon laser 106 may be integrated into STX die 102.

As described above, optoelectronic device module 100 may include other components, such as SRX die 110 mounted on substrate 108. SRX die 110 may include a photodetector 302 to receive light from optical coupling structure 120. More particularly, optical coupling structure 120 may be mounted on STX die 102 to direct light from hybrid silicon laser 106 to photodetector 302 during optoelectronic device module 100 operation. Other components, such as RX IC 112 and PMIC 114 may also be mounted on substrate 108 of optoelectronic device module 100.

Figure 7:
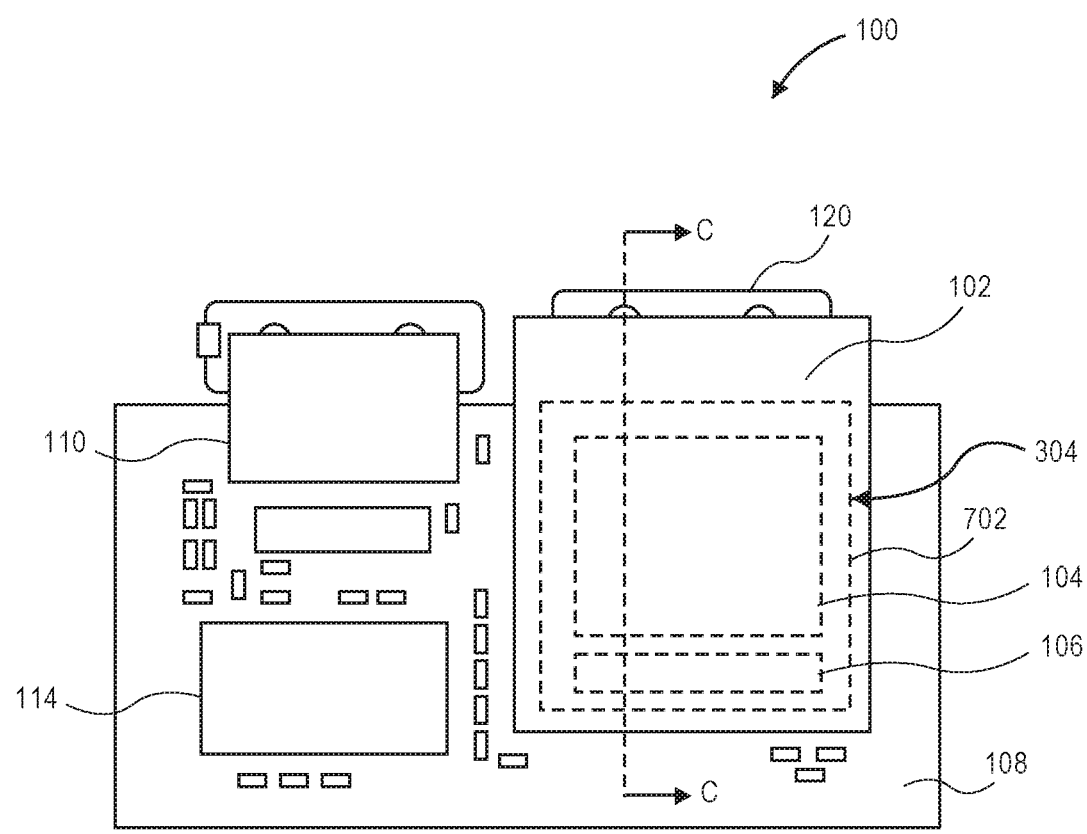
FIG. 7 illustrates a top-down view of an optoelectronic device module having a silicon interposer, in accordance with an embodiment.
Figure 8:
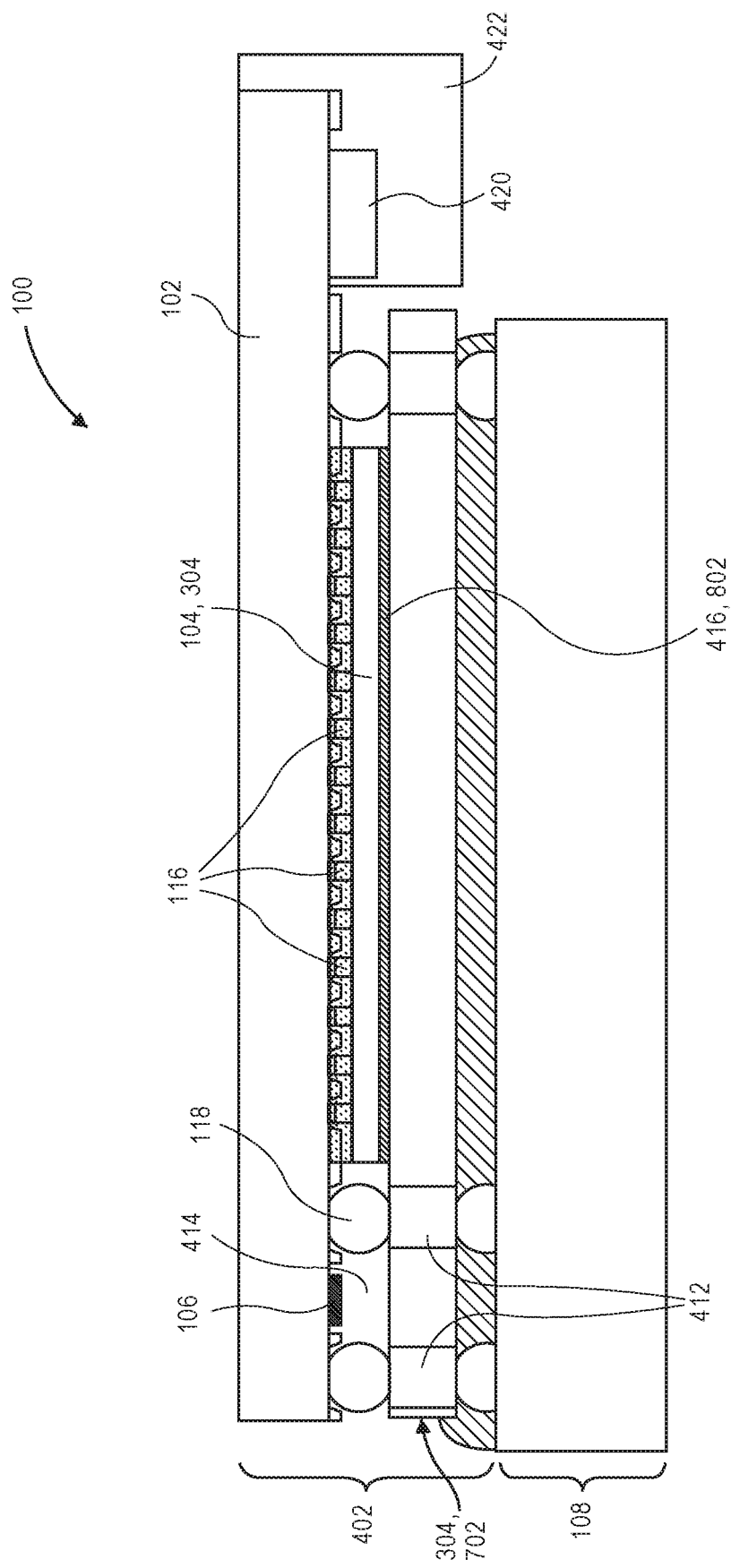
FIG. 8 illustrates a sectional view, taken about line C-C of FIG. 7, of an optoelectronic device module having a silicon interposer, in accordance with an embodiment.

In an embodiment, optoelectronic device module 100 includes a silicon interposer 304, represented by hidden lines in FIG. 3, disposed between hybrid silicon laser 106 and substrate 108. Thus, in contrast to the architecture shown in FIG. 1, in an embodiment, a vertical axis passing through hybrid silicon laser 106 also passes through silicon interposer 304 vertically below hybrid silicon laser 106 and vertically above substrate 108. In an embodiment, silicon interposer 304 incorporates TX IC 104 to drive hybrid silicon laser 106. For example, TX IC 104 may be integrated directly in silicon interposer 304 (FIGS. 3-4) or TX IC 104 may be mounted on a silicon blank of silicon interposer 304 (FIGS. 7-8).

Figure 4:
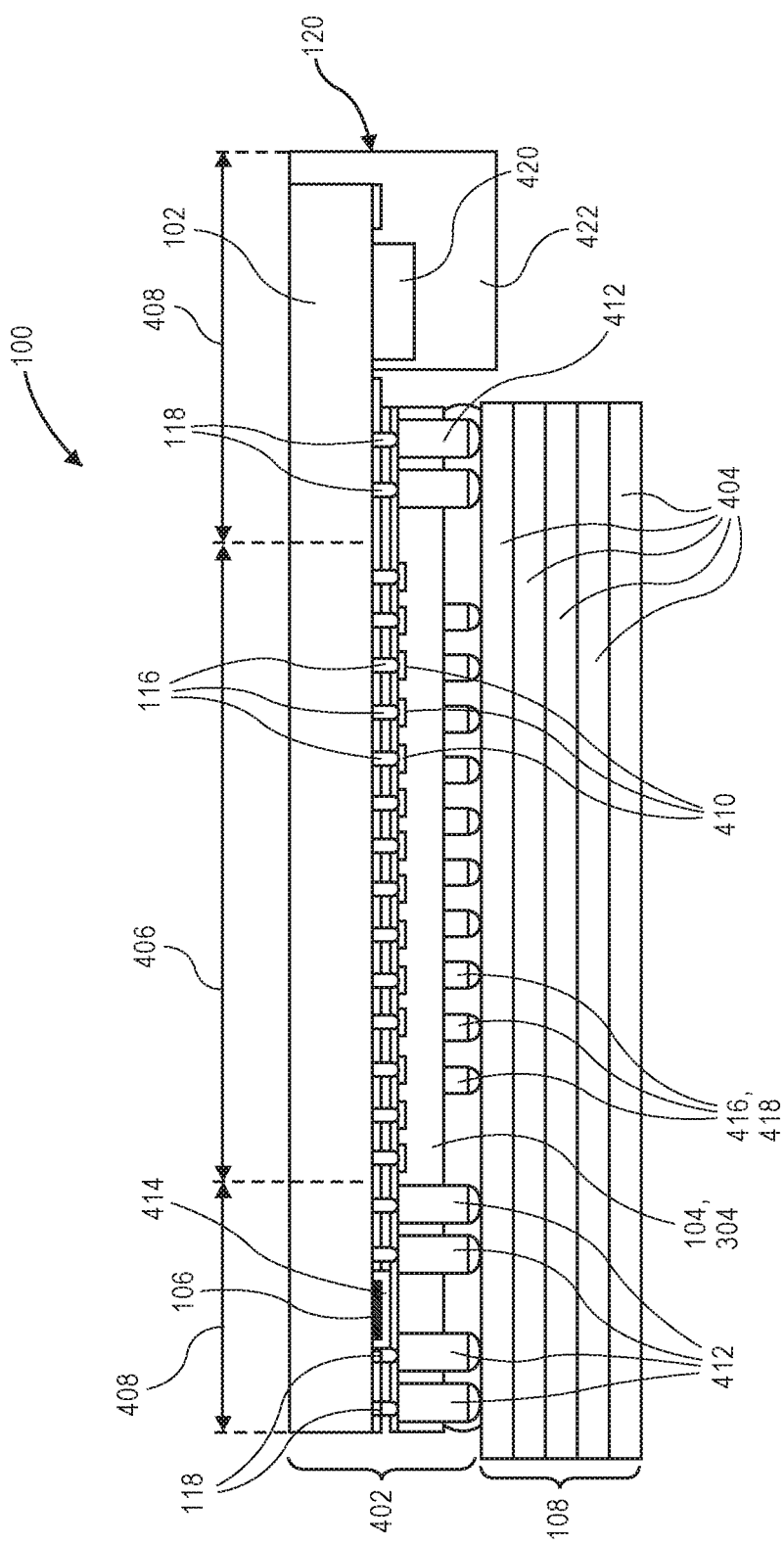
FIG. 4 illustrates a sectional view, taken about line B-B of FIG. 3, of an optoelectronic device module having a silicon interposer, in accordance with an embodiment.

Referring to FIG. 4, a sectional view, taken about line B-B of FIG. 3, of an optoelectronic device module having a silicon interposer is shown in accordance with an embodiment. Optoelectronic device module 100 may include a photonics transmitter subassembly 402 mounted on a top surface of substrate 108. Photonics transmitter subassembly 402 may, for example, include STX die 102 and silicon interposer 304 (which may incorporate TX IC 104 integrally within an active portion of silicon interposer 304). Substrate 108 may include one or more polymer layers 404. For example, substrate 108 may include a high-density integrated substrate having a multilayered stack of organic polymer sheets, as is known in the art.

Optoelectronic device module 100 may include TX IC 104 integrated directly in silicon interposer 304. That is, TX IC 104 may include a structure to allow electrical communication between TX IC 104 and STX die 102, as well as to facilitate electrical communication between STX die 102 and substrate 108.

Electrical signals may be communicated between TX IC 104 and STX die 102 through CoC interconnects 116. In an embodiment, a bottom surface of STX die 102 includes a central region 406 and a peripheral region 408 laterally outward from central region 406. For example, peripheral region 408 of STX die 102 may surround central region 406 of STX die 102. The bottom surface of STX die 102 may be in a face-to-face relationship with, i.e., facing, a top surface of TX IC 104. Furthermore, STX die 102 may include several CoC interconnects 116 extending from the bottom surface in central region 406. Similarly, TX IC 104 may include several top contacts 410 on the top surface facing the bottom surface of STX die 102. The top contacts 410 on TX IC 104 may correspond to the CoC interconnects 116 on STX die 102, and thus, the CoC interconnects 116 may attach to the top contacts 410 to form a face-to-face interconnection between STX die 102 and TX IC 104. Thus, STX die 102 may be stacked on TX IC 104, which is integrated in silicon interposer 304, such that CoC interconnects 116 in central region 406 are electrically connected to top contacts 410.

Electrical signals may be communicated between STX die 102 and substrate 108 through several through silicon vias (TSVs 412). In an embodiment, CoS interconnects 118 are disposed in the peripheral region 408 of STX die 102. Similarly, TSVs 412 may be formed in a portion of silicon interposer 304 below peripheral region 408. That is, TSVs 412 may pass directly through a passive portion, e.g., a silicon substrate portion, of silicon interposer 304 to carry electrical signals from a top surface of silicon interposer 304 to a bottom surface of silicon interposer 304. Accordingly, CoS interconnects 118 of STX die 102 may be attached to TSVs 412 of silicon interposer 304 to communicate electrical signals from STX die 102 to substrate 108. Thus, STX die 102 may be electrically connected to substrate 108 through TSV 412 interconnections of silicon interposer 304 and/or TX IC 104.

In an embodiment, hybrid silicon laser 106 is laterally between CoC interconnects 116 in central region 406 of STX die 102 and CoS interconnects 118 in peripheral region 408 of STX die 102. Accordingly, since silicon interposer 304 extends laterally between CoS interconnects 118 and CoC interconnects 116, silicon interposer 304 is disposed below hybrid silicon laser 106 and between hybrid silicon laser 106 and substrate 108. That is, silicon interposer 304 may form a mechanical bridge extending parallel to the bottom surface of STX die 102 such that an empty space 414 separates hybrid silicon laser 106 from the top surface of silicon interposer 304 and/or TX IC 104. As described below, a method of fabricating optoelectronic device module 100 may provide an architecture having no nonconductive encapsulation 122, e.g., no PI or CUF, covering or in contact with hybrid silicon laser 106. Furthermore, given that STX die 102 and silicon interposer 304 may have similar or identical CTEs, empty space 414 between hybrid silicon laser 106 and silicon interposer 304 may remain vacant despite temperature variations that cause optoelectronic device module 100 components to expand or contract.

Heat may be transferred from STX die 102 and TX IC 104 to substrate 108 to reduce the likelihood of temperature variations that could cause silicon interposer 304 to impinge on and/or damage hybrid silicon laser 106. In an embodiment, silicon interposer 304 and/or TX IC 104 includes a bottom surface facing a top surface of substrate 108. Heat may be transferred from the bottom surface of silicon interposer 304 to the top surface of substrate 108 through a thermal bridge 416. For example, thermal bridge 416 may extend between the bottom surface of TX IC 104 to the top surface of substrate 108. As such, heat generated by TX IC 104 during module operation may dissipate through thermal bridge 416 to substrate 108. Similarly, heat generated by STX die 102 during module operation may dissipate through CoC interconnects 116 and thermal bridge 416 to substrate 108, and through CoS interconnects 118 and TSVs 412 to substrate 108. Accordingly, a dual path of thermal dissipation may exist between STX die 102 and substrate 108, e.g., a first thermal dissipation path from peripheral region 408 of STX die 102 to substrate 108 and a second thermal dissipation path from central region 406 of STX die 102 to substrate 108.

Thermal bridge 416 may include a structure formed from a thermally conductive material. For example, thermal bridge 416 may include one or more dummy interconnect 418, e.g., a copper pillar to dissipate heat from silicon interposer 304 and/or TX IC 104 to substrate 108. Each dummy interconnect 418 may extend between the bottom surface of silicon interposer 304 and the top surface of substrate 108. In an embodiment, several dummy interconnects 418 are arranged in a grid below central region 406 of STX die 102. The grid of dummy interconnects 418 may include a higher density per unit area than a density per unit area of TSVs 412. For example, a spacing between adjacent dummy interconnects 418 may be in a range of 50-100 microns on average, and a spacing between TSVs 412 may be in a range of 200-250 microns on average. The increased interconnect density may provide a corresponding increase in heat dissipation from TX IC 104, and may provide greater mechanical stability by anchoring silicon interposer 304 and/or TX IC 104 to substrate 108.

In an embodiment, dummy interconnect 418 includes a conductive bump, e.g., a copper pillar, attached to an electrical contact of substrate 108 by a thermal compression bond. Other embodiments of thermal bridge 416, however, will be apparent to one skilled in the art. For example, thermal bridge 416 may include a thermal adhesive applied between silicon interposer 304 and substrate 108.

Optical coupling structure 120 of optoelectronic device module 100 may include a structure similar to that described above. For example, optical coupling structure 120 may include a silicon lens 420 and a mechanical optical interface 422 to direct light from hybrid silicon laser 106 to photodetector 302. As shown in FIG. 4, optical coupling structure 120 may include an overhang structure, i.e., one or more of silicon lens 420 or mechanical optical interface 422 may be laterally offset from silicon interposer 304. That is, a lateral plane extending through silicon interposer 304, and having a planar surface parallel to the top surface or the bottom surface of silicon interposer 304, may intersect silicon lens 420 or mechanical optical interface 422 of optical coupling structure 120.

It will be apparent that every bond between STX die 102 and silicon interposer 304 across a width of STX die 102 may be a silicon-to-silicon bond. That is, each CoS interconnect 118 may extend from a silicon portion of STX die 102 to a corresponding TSV 412 disposed within a silicon portion of silicon interposer 304, and each CoC interconnect 116 may extend from a silicon portion of STX die 102 to a corresponding top contact 410 disposed within a silicon portion of silicon interposer 304 and/or TX IC 104. Accordingly, optoelectronic device module 100 having silicon interposer 304 between STX die 102 and substrate 108 provides zero CTE mismatch between STX die 102 and silicon interposer 304. Thus, hybrid silicon laser 106 may be protected above empty space 414 because nonconductive material may be absent below the hybrid laser array such that no polymer material presses against the hybrid laser array during module operation.

Figure 5:
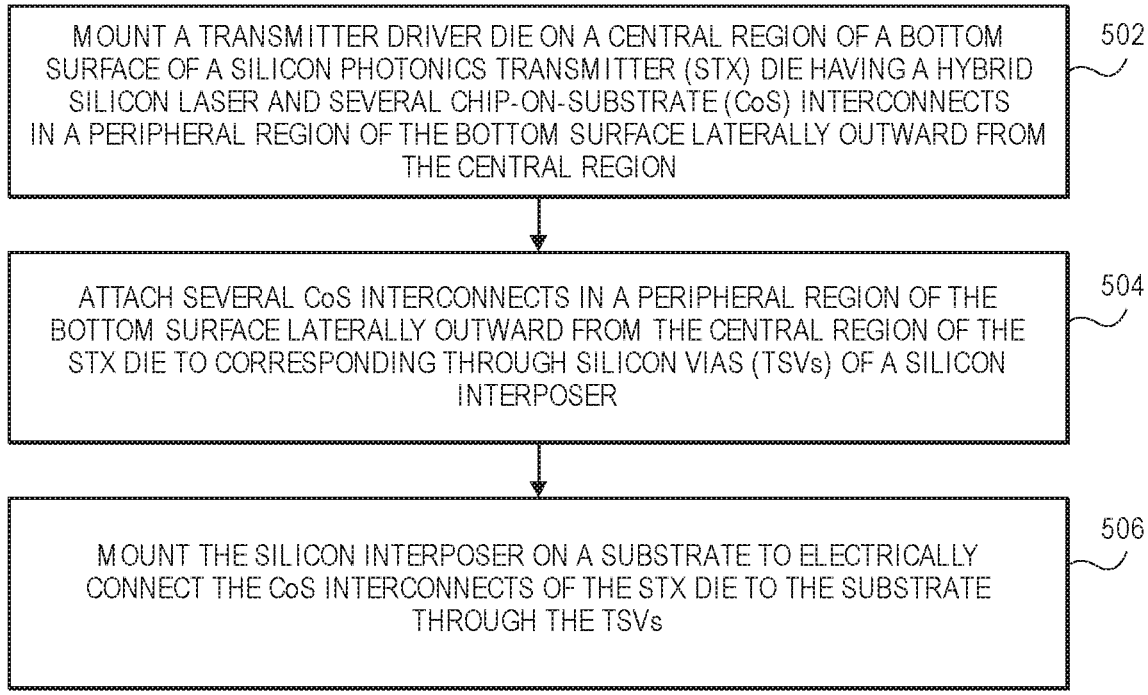
FIG. 5 illustrates a method of fabricating an optoelectronic device module having a silicon interposer, in accordance with an embodiment.

Referring to FIG. 5, a method of fabricating an optoelectronic device module having a silicon interposer is shown in accordance with an embodiment. More particularly, the method may be used to fabricate optoelectronic device module 100 having silicon interposer 304 including an integrated TX IC 104. FIGS. 6A-6L show, operations of the method of fabricating an optoelectronic device module 100 according to FIG. 5. For example, FIGS. 6A-6G illustrate an overall wafer mid-end-of-line (MEOL) process for preparing silicon interposer 304 having integrated TX IC 104, and FIGS. 6H-6L illustrate an assembly process for mounting TX IC 104 on STX die 102, and mounting STX die 102 on substrate 108. Accordingly, the method is described below with alternating reference to FIGS. 5 and 6A-6G as indicated.

Figure 6A:
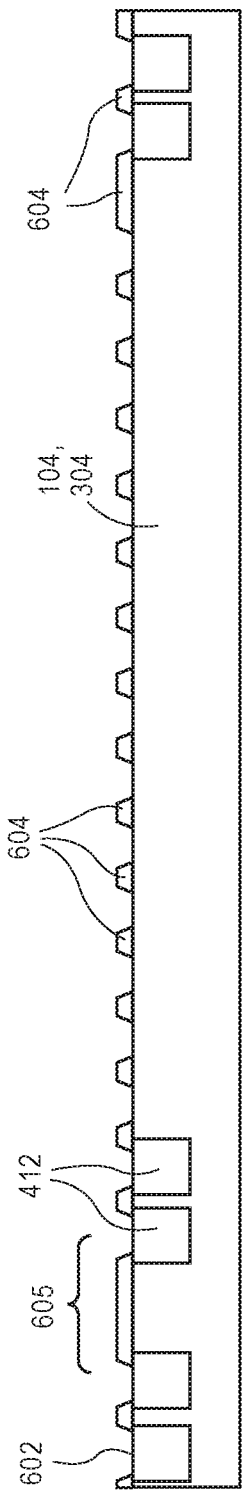

Referring to FIG. 6A, the MEOL process includes a bumping process on a wafer front side of silicon interposer and/or TX IC. For example, silicon interposer 304 having an integrated TX IC 104 may include several TSVs 412 extending from wafer front side 602 through a passive silicon portion of silicon interposer 304. The bumping process may form several polyimide bumps 604 extending upward from wafer front side 602. Furthermore, the bump width and pitch may vary across silicon interposer 304. For example, polyimide bumps 604 formed over a laser area 605 may be wider than, e.g., polyimide bumps 604 formed over a central region of silicon interposer 304 having the integrated TX IC 104. Laser area 605 may correspond to a region of silicon interposer 304 intended to be disposed below hybrid silicon laser 106 after assembly of the photonics transmitter subassembly 402, or between hybrid silicon laser 106 and substrate 108 after assembly of optoelectronic device module 100. Thus, a polyimide bump 604 may be below hybrid silicon laser 106 and separated from hybrid silicon laser 106 by empty space 414 after assembly. In an embodiment, polyimide bumps 604 over the central region having TX IC 104 may have a smaller pitch, i.e., separation distance, than polyimide bumps 604 over the peripheral region of TX IC 104. That is, polyimide bumping in the central region may be fine pitched and polyimide bumping in the peripheral region may be coarse pitched. The difference in pitch may correspond to the higher density of CoC interconnects 116 as compared to the density of CoS interconnects 118, as described above.

Figure 6B:
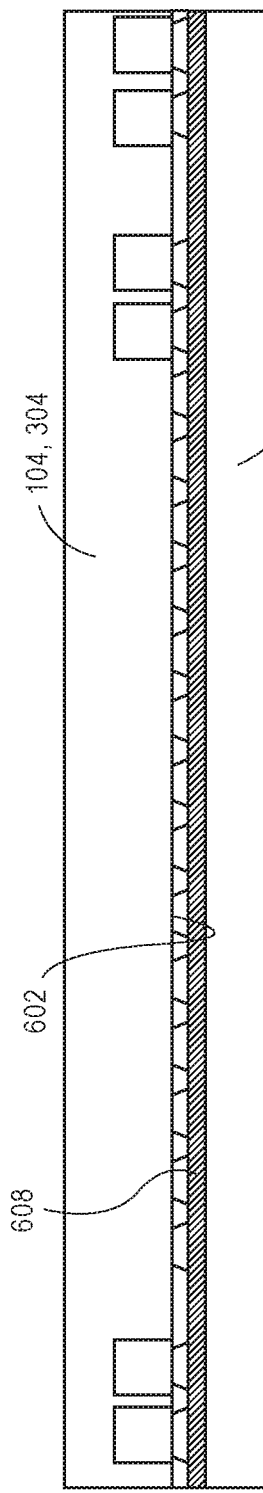

Referring to FIG. 6B, wafer front side 602 of silicon interposer 304/TX IC 104 may be mounted on a wafer support system 606 (WSS). WSS may be a carrier used to stabilize silicon interposer 304 and/or TX IC 104 during a back grinding process. A releasing film 608 may be disposed between WSS and polyimide bumps 604 of silicon interposer 304.

Figure 6C:
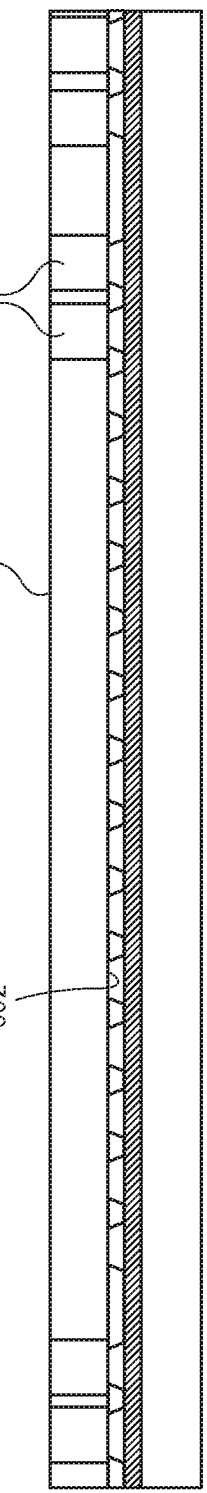

Referring to FIG. 6C, a wafer backside 610 of silicon interposer 304 and/or TX IC 104 may be subjected to a wafer back grinding process to remove silicon material until TSVs 412 extend from wafer front side 602 to the ground wafer backside 610. In an embodiment, the processed silicon interposer 304 includes a thickness, i.e., a TSV 412 height, in a range of 40-100 microns, e.g., 50 microns.

Figure 6D:
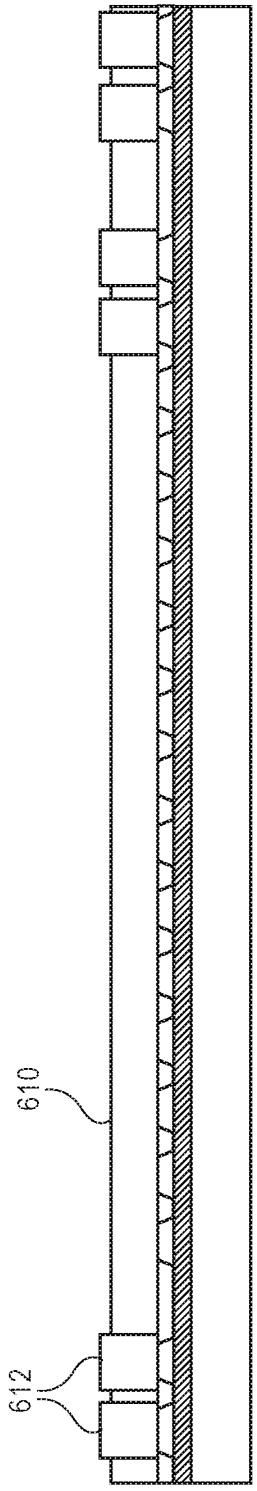

Referring to FIG. 6D, a TSV backside 612 may be revealed above wafer backside 610. For example, a dryer chemical etching process may be applied to silicon interposer 304 and/or TX IC 104 to remove material from wafer backside 610 such that TSV backside 612 extends above wafer backside 610. That is, after the etching process, TSVs 412 in a peripheral region of silicon interposer 304 may have a height or thickness greater than a height or thickness of TX IC 104 in a central region of silicon interposer 304.

Figure 6E:
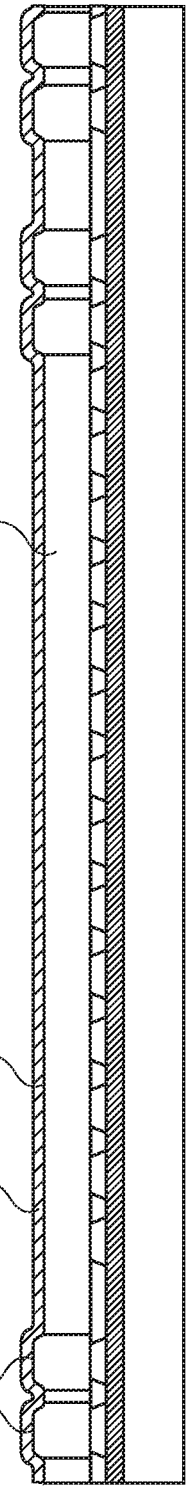

Referring to FIG. 6E, a passivation layer 614 may be deposited on the revealed TSV backsides 612. For example, a plasma-enhanced chemical vapor deposition (PECVD) process may be used to passivate TSVs 412, which may be formed from copper. Passivation layer 614 may extend across the width of silicon interposer 304. More particularly, passivation layer 614 may cover wafer backside 610.

Figure 6F:
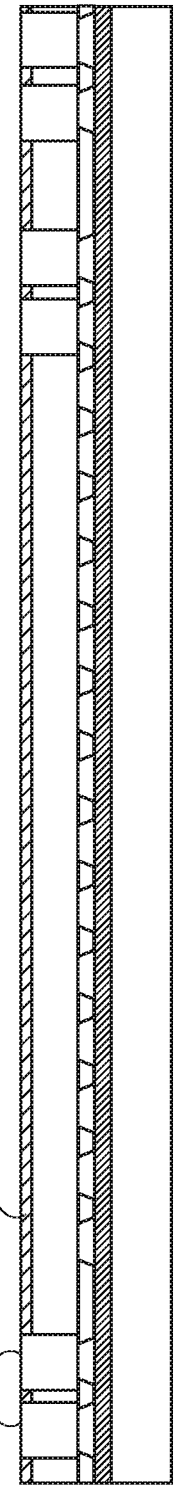

Referring to FIG. 6F, a chemical mechanical polishing (CMP) process may be used to reveal TSV backsides 612 through passivation layer 614. That is, the CMP process may remove passivation layer 614 over TSV backside 612 such that TSV backside 612 is exposed.

Figure 6G:
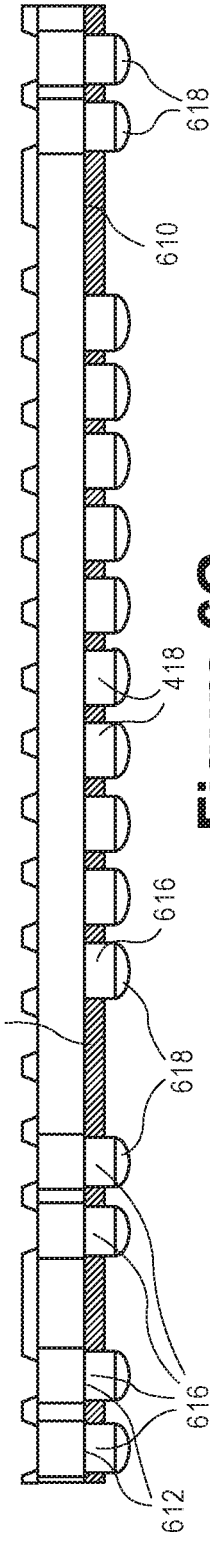

Referring to FIG. 6G, a bumping process may be applied to wafer backside 610. The bumping process may form copper pillars 616 that extend from TSV backside 612 beyond passivation layer 614. For example, tin-silver bumps 618 may be formed on copper pillars 616 at a height farther from wafer backside 610 than an outer surface of passivation layer 614. Conductive bumps, e.g., copper pillar 616 and tin-silver bump 618 structures, formed in the central region of silicon interposer 304 may provide dummy interconnects 418 as described above. Silicon interposer 304 may be released from the WSS before or after the bumping process. That is, the WSS carrier may be removed from silicon interposer 304 and/or TX IC 104. Accordingly, silicon interposer 304 having an integrated TX IC 104 and TSVs 412 extending from wafer front side 602 to wafer backside 610 may be provided to assemble into a photonics transmitter subassembly 402.

The photonics transmitter subassembly 402 may include STX die 102 as described above. For example, referring to FIG. 6H, silicon lens 420 and mechanical optical interface 422 may be attached to a silicon substrate 108 of STX die 102. Silicon lens 420 and mechanical optical interface 422 may be mounted on the bottom surface of STX die 102 to form an overhang structure along an edge of the die. By way of example, silicon lens 420 and mechanical optical interface 422 may be attached to STX die 102 by a thermocompression bond or by a UV adhesive bond.

Referring to FIG. 6I, nonconductive material, e.g., a nonconductive film lamina 620, may be layered on silicon interposer 304 and/or TX IC 104. For example, nonconductive film lamina 620 may cover polyimide bumps 604 formed on wafer front side 602. It is noted, however, that in an embodiment, nonconductive film lamina 620 does not extend over laser area 605 in a peripheral region of silicon interposer 304. Thus, nonconductive film lamina 620 may be excluded from laser area 605.

Referring to FIG. 6J, at operation 502, assembly of the photonics transmitter subassembly 402 may include mounting TX IC 104 on central region 406 of a bottom surface of STX die 102. Mounting TX IC 104 on STX die 102 may include attaching one or more CoC interconnects 116 of STX die 102 to top contacts 410 of silicon interposer 304 and/or TX IC 104. Such attachment may be performed using thermocompression bonding. At operation 504, several CoS interconnects 118 in peripheral region 408 of STX die 102 may be attached to corresponding TSVs 412 of silicon interposer 304. Such attachment may be performed using thermocompression bonding.

Figure 6K:
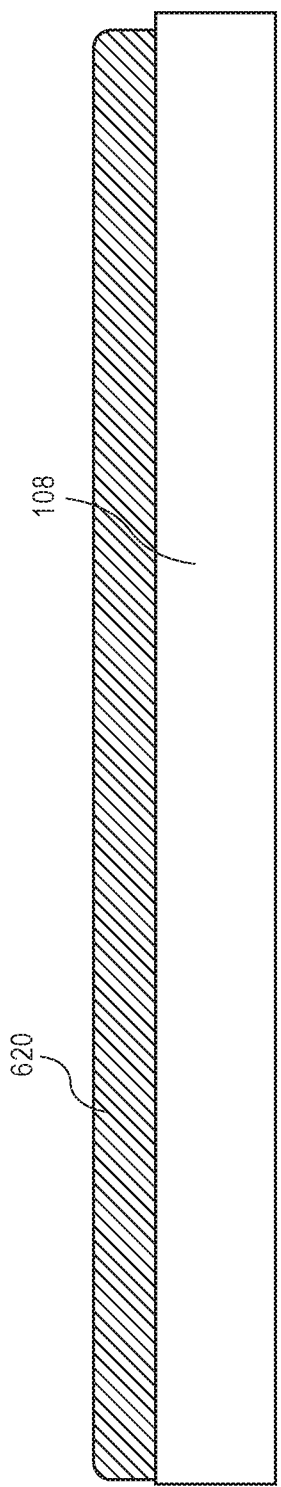

After attaching CoS interconnects 118 to corresponding TSVs 412 and attaching CoC interconnects 116 to corresponding top contacts 410, the photonics transmitter subassembly 402 may be mounted on substrate 108. Referring to FIG. 6K, substrate 108 may be prepared for assembly into optoelectronic device module 100. More particularly, a nonconductive film lamina 620 may be layered over a top surface of substrate 108. Nonconductive film lamina 620 may include a nonconductive polymer or an underfill dispensed onto the top surface.

Figure 6L:
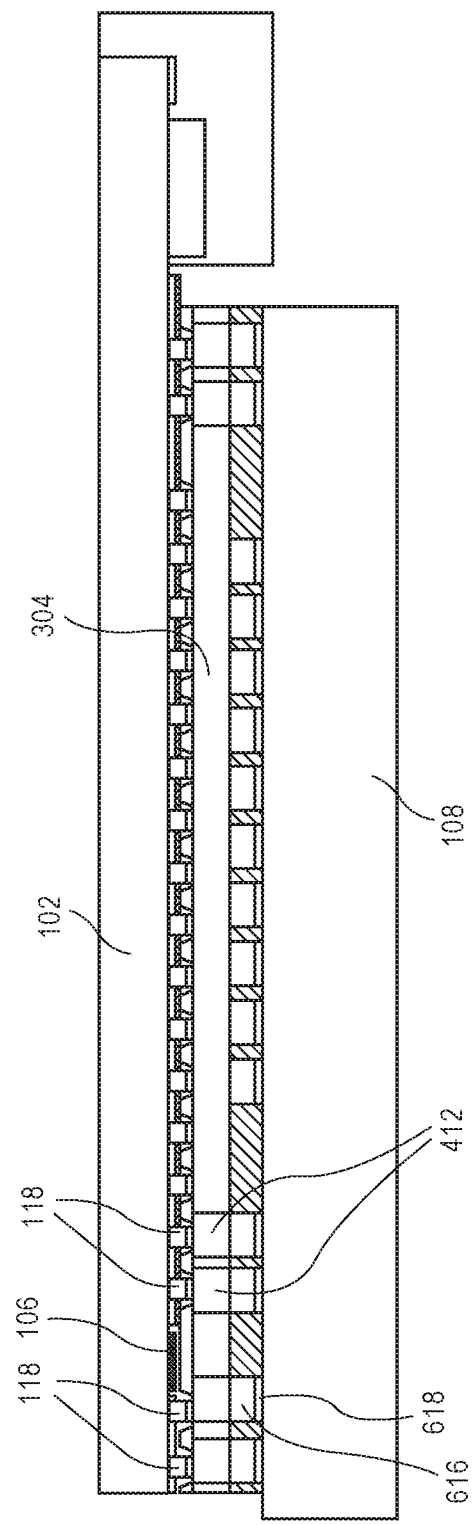

Referring to FIG. 6L, at operation 506, silicon interposer 304 may be mounted on substrate 108 to electrically connect CoS interconnects 118 of STX die 102 to substrate 108 through TSVs 412. More particularly, copper pillars 616 and/or tin-silver bumps 618 extending from a portion of TSVs 412 within a passive silicon portion of silicon interposer 304 may be attached to corresponding electrical contacts on substrate 108. Such attachment may be performed using thermocompression bonding technique to form thermocompression bonds between STX die 102, silicon interposer 304, and/or substrate 108. Such attachment may also be performed using a solder mass reflow technique.

Referring to FIG. 7, a top-down view of an optoelectronic device module having a silicon interposer is shown in accordance with an embodiment. Optoelectronic device module 100 may include the same or similar components as described above with respect to FIG. 3. For example, optoelectronic device module 100 may include optical coupling structure 120 mounted on STX die 102, SRX die 110, PMIC 114, etc. In an embodiment, silicon interposer 304 disposed between STX die 102 and substrate 108 incorporates several components. For example, silicon interposer 304 may include TX IC 104 mechanically coupled to a silicon blank 702. Silicon blank 702 may be described as being a passive interposer. That is, as opposed to silicon interposer 304 having a monolithic structure incorporating a passive portion and an active portion, i.e., TX IC 104, as described above, silicon blank 702 may have no integrated circuit or transistors. By comparison, this lack of logic circuitry may qualify the silicon blank 702 portion of silicon interposer 304 of FIGS. 7-8 as being "passive" and the integration of logic circuitry in silicon interposer 304 of FIGS. 3-4 may qualify that component as being "active."

Referring to FIG. 8, a sectional view, taken about line C-C of FIG. 7, of an optoelectronic device module having a silicon interposer is shown in accordance with an embodiment. As described above, optoelectronic device module 100 may include STX die 102 in a face-to-face interconnection with TX IC 104. TX IC 104, however, may not include TSVs 412 used to electrically connect STX die 102 to substrate 108. For example, silicon interposer 304 may include an active portion having TX IC 104 and a passive portion having silicon blank 702. TSVs 412 may pass through silicon blank 702 at a location laterally outward from TX IC 104. Thus, central region 406 of STX die 102 may be electrically connected to the active portion of silicon interposer 304 and peripheral region 408 of STX die 102 may be electrically connected to TSVs 412 in the passive portion of silicon interposer 304.

The active portion of 304 may be stacked on the passive portion of 304. For example, the active portion of silicon interposer 304, e.g., TX IC 104, may include a bottom surface facing a top surface of the passive portion of silicon interposer 304, e.g., silicon blank 702. Accordingly, the bottom surface of the active portion may be attached to the top surface of the passive portion. For example, silicon interposer 304 may include thermal bridge 416 coupling TX IC 104 to silicon blank 702. In an embodiment, thermal bridge 416 extends from the bottom surface of TX IC 104 to the top surface of silicon blank 702. Thermal bridge 416 may include one or more dummy interconnects 418 as described above, or thermal bridge 416 may include a thermal adhesive 802 between the bottom surface of TX IC 104 and the top surface of silicon interposer 304. Thus, a stable silicon interposer 304 may be formed to provide an interface between STX die 102 and substrate 108.

Silicon interposer 304 shown in FIG. 8 may support the die-to-substrate bond in a similar manner to silicon interposer 304 shown in FIG. 4. Peripheral region 408 of STX die 102 may be in a face-to-face relationship with silicon blank 702. For example, silicon blank 702 may bridge the distance between TSVs 412, and thus, silicon blank 702 may be disposed between hybrid silicon laser 106 and substrate 108. Accordingly, CTE mismatch between a portion of STX die 102 having hybrid silicon laser 106 and a portion of silicon interposer 304 below hybrid silicon laser 106 may be reduced. Thus, in an embodiment, no underfill material is required to stabilize the portion of silicon interposer 304 below hybrid silicon laser 106 such that empty space 414 may be disposed between hybrid silicon laser 106 and silicon blank 702 and no pressure is applied to hybrid silicon laser 106 by a nonconductive filler material.

In an embodiment, CoS interconnects 118 of STX die 102 are attached to TSVs 412 of silicon blank 702 to electrically connect STX die 102 to substrate 108 as described above. Furthermore, the interconnection of CoS interconnects 118 to TSVs 412 provides a thermal path from STX die 102 to substrate 108. As described above, a second thermal path away from STX die 102 may be provided. For example, the second thermal path may pass from STX die 102 through TX IC 104 and thermal adhesive 802 into silicon blank 702. Heat transferred from STX die 102 into silicon blank 702 may then distribute throughout a central region of silicon blank 702 and/or through TSVs 412 into substrate 108.

Figure 9:
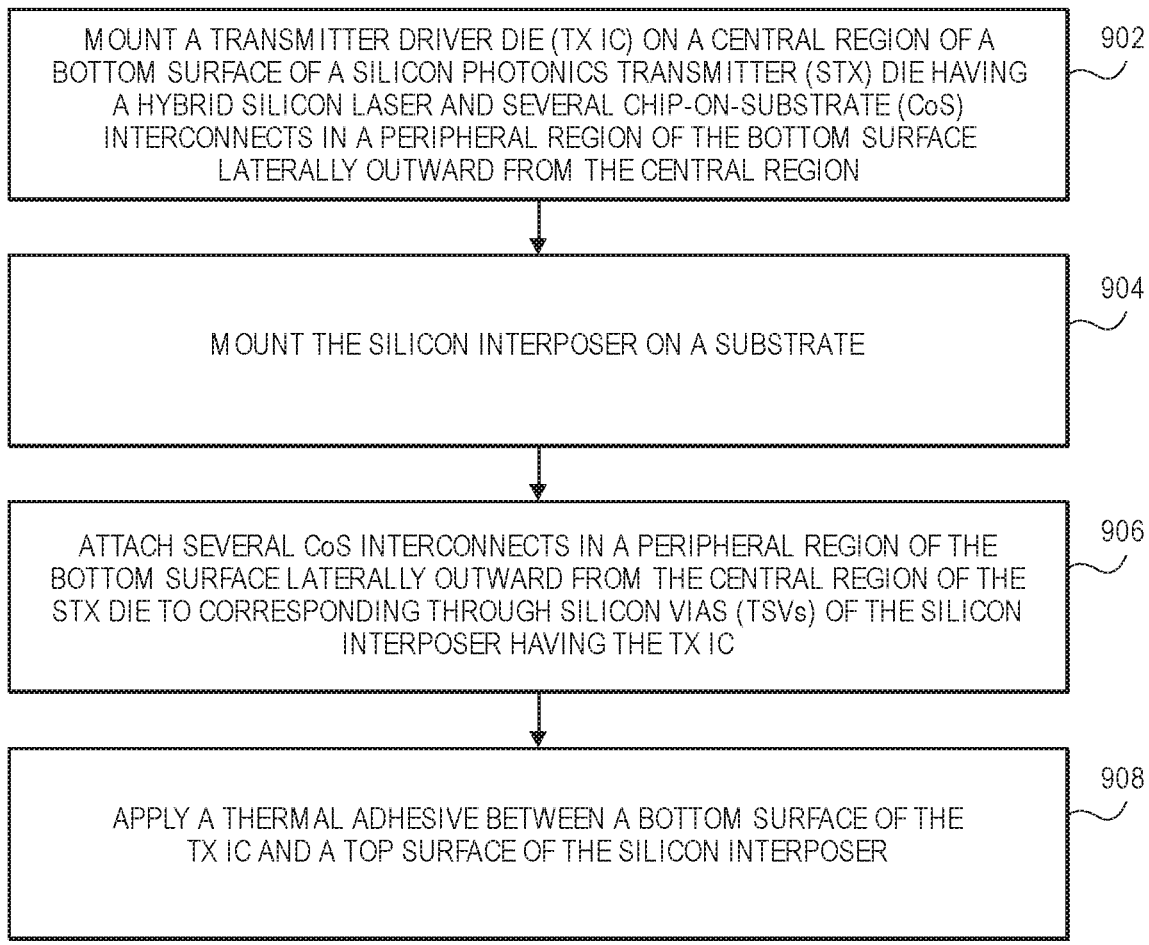
FIG. 9 illustrates a method of fabricating an optoelectronic device module having a silicon interposer, in accordance with an embodiment.

Referring to FIG. 9, a method of fabricating an optoelectronic device module having a silicon interposer is shown in accordance with an embodiment. More particularly, the method may be used to fabricate optoelectronic device module 100 having silicon interposer 304 including TX IC 104 attached to silicon blank 702. Referring to FIGS. 10A-10E, operations of the method of fabricating an optoelectronic device module 100 according to FIG. 9 are shown. Accordingly, the method is described below with alternating reference to FIGS. 9 and 10A-10E as indicated.

Referring to FIG. 10A, silicon lens 420 and mechanical optical interface 422 may be attached to a silicon substrate of STX die 102. For example, silicon lens 420 and mechanical optical interface 422 may be mounted on the bottom surface of STX die 102 to form an overhang structure along an edge of the die. By way of example, silicon lens 420 and mechanical optical interface 422 may be attached to STX die 102 by a thermocompression bond or by a UV adhesive bond. Interconnect bumps may also be formed on STX die 102, e.g., CoS interconnects 118 in peripheral region 408 and CoC interconnects 116 in central region 406. In an embodiment, CoS interconnects 118 include solder bumps and CoC interconnects 116 include copper pillars.

Referring to FIG. 10B, nonconductive film lamina 620 may be applied over CoC interconnects 116 of STX die 102. More particularly, central region 406 over which STX die 102 interfaces with TX IC 104 may include an underfill material. Peripheral region 408, however, may lack nonconductive film lamina 620. Accordingly, no underfill material may be located below hybrid silicon laser 106.

Referring to FIG. 10C, at operation 902, assembly of the photonics transmitter subassembly 402 may include mounting TX IC 104 on central region 406 of a bottom surface of STX die 102. Mounting TX IC 104 on STX die 102 may include attaching one or more CoC interconnects 116 of STX die 102 to top contacts 410 of TX IC 104. Such attachment may be performed using thermocompression bonding.

Referring to FIG. 10D, at operation 904, silicon interposer 304 may be mounted on substrate 108. More particularly, the passive portion of silicon interposer 304, e.g., silicon blank 702, may be attached to substrate 108. For example, substrate 108 may include one or more top interconnects 1002 on a top surface. Top interconnects 1002 may be positioned to correspond to TSVs 412 in silicon blank 702. Accordingly, silicon blank 702 may be assembled to substrate 108 by attaching TSVs 412 to top interconnects 1002 using, e.g., thermal compression bonding and/or solder reflow processes. The passive portion of silicon interposer 304 may be attached to substrate 108 before or after attachment to the active portion of silicon interposer 304. That is, although the process flow is described in a particular order here, certain operations may be reordered, e.g., operation 904 may follow the below-described operation 908.

After mounting silicon blank 702 on substrate 108, a nonconductive underfill material may be applied between silicon blank 702 and substrate 108. More particularly, an underfill material 1004 may be dispensed into a gap between a bottom surface of silicon blank 702 and a top surface of substrate 108 to fill the gap and surround top interconnects 1002. The underfill material 1004 may mechanically stabilize top interconnects 1002. The nonconductive material, however, may not be applied above silicon blank 702, and thus, there may eventually be no nonconductive material between silicon blank 702 and hybrid silicon laser 106.

Referring to FIG. 10E, at operation 906, several CoS interconnects 118 in peripheral region 408 of STX die 102 may be attached to corresponding TSVs 412 of silicon interposer 304. That is, CoS interconnects 118 may be attached to TSVs 412 in silicon blank 702. Such attachment may be performed using thermocompression bonding or solder reflow processes.

At operation 908, a gap between TX IC 104 in silicon blank 702 may be filled. For example, thermal adhesive 802 may be applied between a bottom surface of TX IC 104 and a top surface of silicon blank 702. Thus, thermal bridge 416 may be formed between TX IC 104 and silicon blank 702 to provide a thermal path for heat transfer away from STX die 102.

Figure 11:
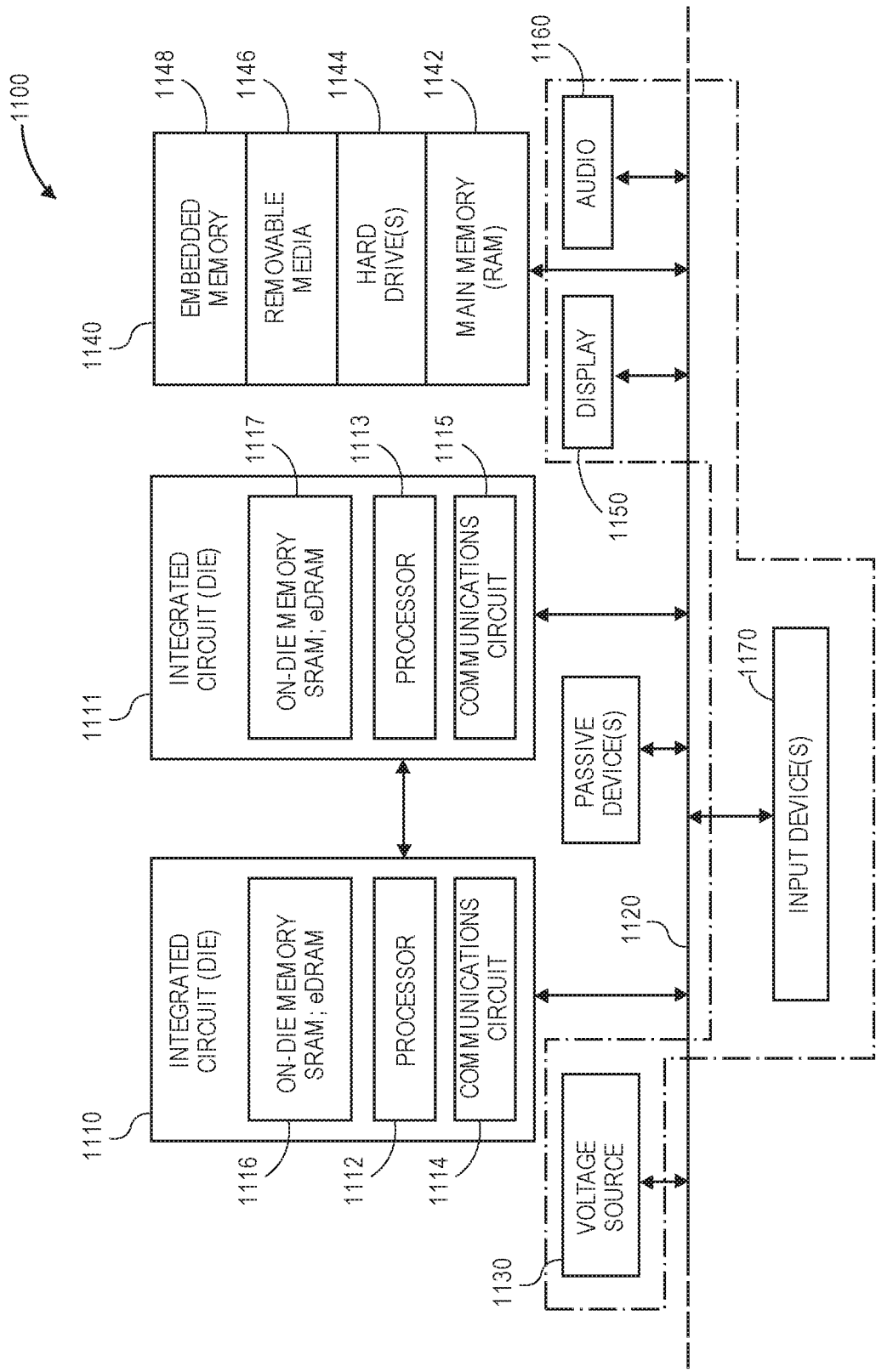
FIG. 11 is a schematic of a computer system, in accordance with an embodiment.

FIG. 11 is a schematic of a computer system, in accordance with an embodiment. The computer system 1100 (also referred to as the electronic system 1100) as depicted can embody an optoelectronic device module having a silicon photonics transmitter die connected to a silicon interposer, according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader. The computer system 1100 may be a server system. The computer system 1100 may be a supercomputer or high-performance computing system.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, an optoelectronic device module having a silicon photonics transmitter die connected to a silicon interposer, as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1111 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In an embodiment, the electronic system 1100 also includes a display device 1150, and an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including an optoelectronic device module having a silicon photonics transmitter die connected to a silicon interposer, according to any of the several disclosed embodiments and their equivalents, an electronic system, a computer system, one or more methods of fabricating an integrated circuit, and one or more methods of fabricating an electronic assembly that includes an optoelectronic device module having a silicon photonics transmitter die connected to a silicon interposer, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having an optoelectronic device module having a silicon photonics transmitter die connected to a silicon interposer embodiments and their equivalents. A foundation substrate may be included, as represented by the dashed line of FIG. 11. Passive devices may also be included, as is also depicted in FIG. 11.

Embodiments of optoelectronic device modules and photonics transmitter subassemblies having a silicon photonics transmitter die connected to a silicon interposer are described above. In an embodiment, an optoelectronic device module includes a substrate having a polymer layer. The substrate includes a top surface. The optoelectronic device module includes a silicon photonics transmitter (STX) die having a bottom surface and a hybrid silicon laser on the bottom surface. The bottom surface of the STX die faces the top surface of the substrate. The optoelectronic device module includes a silicon interposer between the hybrid silicon laser and the substrate. The silicon interposer includes several through silicon vias (TSVs). The STX die is electrically connected to the substrate through the TSVs.

In one embodiment, the bottom surface of the STX die includes a central region and a peripheral region laterally outward from the central region. The STX die includes several chip-on-chip (CoC) interconnects in the central region and several chip-on-substrate (CoS) interconnects in the peripheral region. The CoS interconnects are attached to the TSVs of the silicon interposer.

In one embodiment, the hybrid silicon laser is laterally between the CoC interconnects and the CoS interconnects.

In one embodiment, the silicon interposer includes a transmitter driver die (TX IC) to drive the hybrid silicon laser. The TX IC includes a top surface facing the bottom surface of the STX die. The top surface of the TX IC includes several top contacts electrically connected to the CoC interconnects of the STX die.

In one embodiment, the TSVs pass through the TX IC. The TX IC includes a bottom surface facing the top surface of the substrate. The silicon interposer includes a thermal bridge extending between the bottom surface of the TX IC and the top surface of the substrate.

In one embodiment, the thermal bridge includes several dummy interconnects below the central region of the STX die. The dummy interconnects have a higher density per unit area than the TSVs.

In one embodiment, the silicon interposer includes a silicon blank. The TSVs pass through the silicon blank. The TX IC includes a bottom surface facing a top surface of the silicon blank. The silicon interposer includes a thermal bridge coupling the TX IC to the silicon blank.

In one embodiment, the optoelectronic device module includes a silicon photonics receiver (SRX) die mounted on the substrate. The SRX die includes a photodetector. The optoelectronic device modules includes an optical coupling structure mounted on the STX die. The optical coupling structure includes a silicon lens and a mechanical optical interface to direct light from the hybrid silicon laser to the photodetector.

In one embodiment, the hybrid silicon laser is separated from a top surface of the silicon interposer by an empty space.

In an embodiment, a photonics transmitter subassembly includes a silicon photonics transmitter (STX) die having a bottom surface and a hybrid silicon laser on the bottom surface. The STX die includes several chip-on-substrate (CoS) interconnects. The photonic transmitter subassembly includes a silicon interposer having a top surface facing the bottom surface of the STX die. The silicon interposer includes several through silicon vias (TSVs). The several CoS interconnects are attached to the TSVs.

In one embodiment, the bottom surface of the STX die includes a central region and a peripheral region laterally outward from the central region. The STX die includes several chip-on-chip (CoC) interconnects in the central region. The several chip-on-substrate (CoS) interconnects are in the peripheral region.

In one embodiment, the hybrid silicon laser is laterally between the CoC interconnects and the CoS interconnects.

In one embodiment, the silicon interposer includes a transmitter driver die (TX IC) to drive the hybrid silicon laser. The TX IC includes a top surface facing the bottom surface of the STX die. The top surface of the TX IC includes several top contacts electrically connected to the CoC interconnects of the STX die.

In one embodiment, the TSVs pass through the TX IC. The TX IC includes a bottom surface. The TX IC includes a thermal bridge extending from the bottom surface of the TX IC.

In one embodiment, the silicon interposer includes a silicon blank. The TSVs pass through the silicon blank. The TX IC includes a bottom surface facing a top surface of the silicon blank. The silicon interposer includes a thermal bridge coupling the bottom surface of the TX IC to the top surface of the silicon blank.

In one embodiment, the hybrid silicon laser is separated from the top surface of the silicon interposer by an empty space.

In an embodiment, a method of fabricating an optoelectronic device module having a silicon interposer includes mounting a transmitter driver die (TX IC) on a central region of a bottom surface of a silicon photonics transmitter (STX) die. The STX die includes a hybrid silicon laser and several chip-on-substrate (CoS) interconnects in a peripheral region of the bottom surface laterally outward from the central region. The method includes attaching the several CoS interconnects of the STX die to several through silicon vias (TSVs) of a silicon interposer. The method includes mounting the silicon interposer on a substrate to electrically connect several CoS interconnects of the STX die to the substrate through the TSVs.

In one embodiment, attaching the several CoS interconnects of the STX die to the several TSVs includes thermocompression bonding the several CoS interconnects to the several TSVs.

In one embodiment, mounting the silicon interposer on the substrate includes attaching a thermal bridge extending from a bottom surface of the TX IC to the substrate.

In one embodiment, the method includes applying a thermal adhesive between a bottom surface of the TX IC and a top surface of the silicon interposer.

What is claimed is:

1. An optoelectronic device module, comprising:
   a substrate having a polymer layer, wherein the substrate includes a top surface;
   a silicon photonics transmitter (STX) die having a bottom surface and a hybrid silicon laser on the bottom surface, wherein the bottom surface of the STX die faces the top surface of the substrate; and
   a silicon interposer between the hybrid silicon laser and the substrate, wherein the silicon interposer includes a plurality of through silicon vias (TSVs), wherein the STX die is electrically connected to the substrate through the TSVs, and wherein the silicon interposer comprises a plurality of dummy interconnects coupled to the substrate.

2. The optoelectronic device module of claim 1, wherein the bottom surface of the STX die includes a central region and a peripheral region laterally outward from the central region, wherein the STX die includes a plurality of chip-on-chip (CoC) interconnects in the central region and a plurality of chip-on-substrate (CoS) interconnects in the peripheral region, and wherein the CoS interconnects are attached to the TSVs of the silicon interposer.

3. The optoelectronic device module of claim 2, wherein the hybrid silicon laser is laterally between the CoC interconnects and the CoS interconnects.

4. The optoelectronic device module of claim 2, wherein the silicon interposer includes a transmitter driver die (TX IC) to drive the hybrid silicon laser, wherein the TX IC includes a top surface facing the bottom surface of the STX die, and wherein the top surface of the TX IC includes a plurality of top contacts electrically connected to the CoC interconnects of the STX die.

5. The optoelectronic device module of claim 4, wherein the TSVs pass through the TX IC, wherein the TX IC includes a bottom surface facing the top surface of the substrate, and wherein the silicon interposer includes a thermal bridge extending between the bottom surface of the TX IC and the top surface of the substrate.

6. The optoelectronic device module of claim 5, wherein the thermal bridge includes the plurality of dummy interconnects below the central region of the STX die, and wherein the dummy interconnects have a higher density per unit area than the TSVs.

7. The optoelectronic device module of claim 4, wherein the silicon interposer includes a silicon blank, wherein the TSVs pass through the silicon blank, wherein the TX IC includes a bottom surface facing a top surface of the silicon blank, and wherein the silicon interposer includes a thermal bridge coupling the TX IC to the silicon blank.

8. The optoelectronic device module of claim 1 further comprising:
a silicon photonics receiver (SRX) die mounted on the substrate, wherein the SRX die includes a photodetector; and
an optical coupling structure mounted on the STX die, wherein the optical coupling structure includes a silicon lens and a mechanical optical interface to direct light from the hybrid silicon laser to the photodetector.

9. The optoelectronic device module of claim 1, wherein the hybrid silicon laser is separated from a top surface of the silicon interposer by an empty space.

10. A photonics transmitter subassembly, comprising:
a silicon photonics transmitter (STX) die having a bottom surface and a hybrid silicon laser on the bottom surface, wherein the STX die includes a plurality of chip-on-substrate (CoS) interconnects; and
a silicon interposer having a top surface facing the bottom surface of the STX die, wherein the silicon interposer includes a plurality of through silicon vias (TSVs), and wherein the plurality of CoS interconnects are attached to the TSVs, and wherein the silicon interposer comprises a plurality of dummy interconnects.

11. The photonics transmitter subassembly of claim 10, wherein the bottom surface of the STX die includes a central region and a peripheral region laterally outward from the central region, wherein the STX die includes a plurality of chip-on-chip (CoC) interconnects in the central region, and wherein the plurality of chip-on-substrate (CoS) interconnects are in the peripheral region.

12. The photonics transmitter subassembly of claim 11, wherein the hybrid silicon laser is laterally between the CoC interconnects and the CoS interconnects.

13. The photonics transmitter subassembly of claim 11, wherein the silicon interposer includes a transmitter driver die (TX IC) to drive the hybrid silicon laser, wherein the TX IC includes a top surface facing the bottom surface of the STX die, and wherein the top surface of the TX IC includes a plurality of top contacts electrically connected to the CoC interconnects of the STX die.

14. The photonics transmitter subassembly of claim 13, wherein the TSVs pass through the TX IC, wherein the TX IC includes a bottom surface, and wherein the TX IC includes a thermal bridge extending from the bottom surface of the TX IC.

15. The photonics transmitter subassembly of claim 13, wherein the silicon interposer includes a silicon blank, wherein the TSVs pass through the silicon blank, wherein the TX IC includes a bottom surface facing a top surface of the silicon blank, and wherein the silicon interposer includes a thermal bridge coupling the bottom surface of the TX IC to the top surface of the silicon blank.

16. The photonics transmitter subassembly of claim 10, wherein the hybrid silicon laser is separated from the top surface of the silicon interposer by an empty space.

* * * * *